(12) United States Patent
Wang et al.

(10) Patent No.: US 8,735,963 B2
(45) Date of Patent: May 27, 2014

(54) FLASH MEMORY CELLS HAVING LEAKAGE-INHIBITION LAYERS

(75) Inventors: Ming-Tsong Wang, Taipei (TW); Tong-Chern Ong, Taipei (TW); Albert Chin, Hsin-Chu (TW); Hsueh-Jen Yang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 518 days.

(21) Appl. No.: 12/168,545

(22) Filed: Jul. 7, 2008

(65) Prior Publication Data

US 2010/0001335 A1   Jan. 7, 2010

(51) Int. Cl.
*H01L 29/792*   (2006.01)

(52) U.S. Cl.
USPC .................................. 257/324; 257/E29.309

(58) Field of Classification Search
USPC .................. 257/316, 324, E21.423, E29.309
See application file for complete search history.

(56) References Cited

U.S. PATENT DOCUMENTS

| | | | |
|---|---|---|---|
| 5,074,952 A | 12/1991 | Zavracky et al. |
| 5,364,806 A | 11/1994 | Ma et al. |
| 5,596,214 A | 1/1997 | Endo |
| 6,031,263 A | 2/2000 | Forbes et al. |
| 6,307,775 B1 | 10/2001 | Forbes et al. |
| 6,617,639 B1 | 9/2003 | Wang et al. |
| 6,709,928 B1 | 3/2004 | Jenne et al. |
| 6,933,218 B1 | 8/2005 | Lee et al. |
| 6,949,804 B2 | 9/2005 | Miyazaki |
| 6,958,513 B2 | 10/2005 | Wang |
| 7,112,539 B2 | 9/2006 | Lee et al. |
| 7,372,098 B2 | 5/2008 | Forbes |
| 7,420,256 B2 | 9/2008 | Chae et al. |
| 7,579,646 B2 | 8/2009 | Wang et al. |
| 7,763,927 B2 | 7/2010 | Wu et al. |
| 7,879,738 B2 | 2/2011 | Wang |
| 7,989,876 B2 | 8/2011 | Yasuda |
| 2002/0106536 A1 | 8/2002 | Lee et al. |
| 2004/0004247 A1 | 1/2004 | Forbes et al. |

(Continued)

FOREIGN PATENT DOCUMENTS

CN   1783457   6/2006

OTHER PUBLICATIONS

Pierret, R.F., vol. IV: Field Effect Devices, Second Edition, Modular Series on Solid State Devices, 1990, 4 pages, Addison-Wesley Publishing Company, Inc., Reading, Massachusetts.

Neamen, D.A., Semiconductor Physics and Devices: Basic Principles, 1992, pp. 60-77 and 717-719, Richard D. Irwin, Inc., Burr Ridge, Illinois.

(Continued)

*Primary Examiner* — Vongsavanh Sengdara
(74) *Attorney, Agent, or Firm* — Slater and Matsil, L.L.P.

(57) ABSTRACT

A semiconductor device includes a semiconductor substrate; a tunneling layer over the semiconductor substrate, wherein the tunneling layer has a first conduction band; a storage layer over the tunneling layer, wherein the storage layer has a second conduction band; a blocking layer over the storage layer, wherein the blocking layer has a third conduction band; a gate electrode over the blocking layer; and at least one of a first leakage-inhibition layer and a second leakage-inhibition layer. The first leakage-inhibition layer is between the tunneling layer and the storage layer, and has a fourth conduction band lower than the first conduction band. The second leakage-inhibition layer is between the blocking layer and the gate electrode, and has a fifth conduction band lower than the third conduction band.

11 Claims, 2 Drawing Sheets

(56) References Cited

U.S. PATENT DOCUMENTS

| | | | |
|---|---|---|---|
| 2004/0032762 A1 | 2/2004 | Blanchard | |
| 2004/0201069 A1* | 10/2004 | Miyazaki | 257/410 |
| 2004/0224459 A1 | 11/2004 | Nishikawa | |
| 2004/0248371 A1 | 12/2004 | Wang | |
| 2005/0062098 A1 | 3/2005 | Mahajani et al. | |
| 2005/0153571 A1 | 7/2005 | Senzaki | |
| 2005/0205969 A1 | 9/2005 | Ono et al. | |
| 2006/0044915 A1 | 3/2006 | Park et al. | |
| 2006/0097306 A1 | 5/2006 | Kim et al. | |
| 2006/0261401 A1* | 11/2006 | Bhattacharyya | 257/316 |
| 2006/0273370 A1 | 12/2006 | Forbes | |
| 2006/0281331 A1* | 12/2006 | Wang | 438/778 |
| 2007/0132010 A1 | 6/2007 | Bhattacharyya | |
| 2007/0138539 A1* | 6/2007 | Wu et al. | 257/324 |
| 2007/0187730 A1 | 8/2007 | Park et al. | |
| 2007/0272916 A1* | 11/2007 | Wang et al. | 257/24 |
| 2008/0067577 A1 | 3/2008 | Wang et al. | |
| 2008/0073689 A1 | 3/2008 | Wang et al. | |
| 2008/0073704 A1* | 3/2008 | Yasuda | 257/324 |

OTHER PUBLICATIONS

Eitan, B., et al., "4-bit per Cell NROM Reliability," IEEE, 2005, pp. 539-542.

Goano, M., et al., "Band structure nonlocal pseudopotential calculation of the III-nitride wurtzite phase materials system. Part II. Ternary alloys $Al_xGa_{1-x}N$, $In_xGa_{1-x}N$, and $In_xAl_{1-x}N$," Journal of Applied Physics, vol. 88, No. 11, Dec. 1, 2000, 2000 American Institute of Physics, pp. 6476-6482.

Green, M. L., et al., "Ultrathin (<4 nm) $SiO_2$ and Si—O—N gate dielectric layers for silicon microelectronics: Understanding the processing, structure, and physical and electrical limits," Journal of Applied Physics, vol. 90, No. 5, Sep. 1, 2001, 2001 American Institute of Physics, pp. 2057-2121.

Shappir, A., et al., "NROM Window Sensing for 2 and 4-bits per cell Products," IEEE, 2006, pp. 68-69.

Yokoyama, S., et al., "Characterization of plasma-enhanced chemically-vapor-deposited silicon-rich silicon dioxide/thermal silicon dioxide dual dielectric systems," Journal of Applied Physics, vol. 54, No. 12, Dec. 1983, 1983 American Institute of Physics, pp. 7058-7065.

* cited by examiner

FLASH MEMORY CELLS HAVING LEAKAGE-INHIBITION LAYERS

CROSS-REFERENCE TO RELATED APPLICATIONS

This application relates to the following commonly-assigned U.S. patent Applications: application Ser. No. 11/440,667, filed May 25, 2006, and entitled "Flash Memory with Deep Quantum Well and High-K Dielectric," and application Ser. No. 11/525,351, filed Sep. 22, 2006, and entitled "Program/Erase Schemes for Floating Gate Memory Cells," which applications are hereby incorporated herein by reference.

TECHNICAL FIELD

This invention relates generally to semiconductor devices, and more particularly to the structures and manufacturing methods of flash memory cells.

BACKGROUND

Flash memory has become increasingly popular in recent years. A typical flash memory includes a memory array having a large number of memory cells arranged in blocks. One of the most commonly known flash memories is the one-transistor flash memory, wherein each of the memory cells is fabricated as a field-effect transistor having a control gate and a floating gate. The floating gate is capable of holding charges, and is separated from source and drain regions contained in a substrate by a layer of thin oxide (tunneling oxide). Each of the memory cells can be electrically charged by injecting electrons from the drain region through the tunneling oxide layer into the floating gate. The charges can be removed from the floating gate by tunneling the electrons to the substrate through the tunneling oxide layer. The data stored in a memory cell is determined by the presence or absence of charges in the floating gate.

It is highly desirable to scale down write/erase voltages of flash memories, which has typically been achieved by decreasing the thickness of the tunneling oxide layers. One method for reducing the thickness of the tunneling oxide layer without causing severe charge loss is using a (poly-) Si—$SiO_2$—SiN—$SiO_2$—Si (SONOS) structure. FIG. 1 illustrates a conventional SONOS flash memory cell. Tunneling oxide layer 2 is formed on silicon substrate 10. Silicon nitride layer (floating gate) 4 is formed on tunneling oxide layer 2, and has local traps for trapping and storing charges. Blocking oxide layer 6 is formed on floating gate 4 to prevent leaked charges from reaching gate electrode 8, which is typically formed of polysilicon.

In conventional SONOS memory cells, charges are stored inside the discrete and electrically isolated traps of nitride (SiN), while only the trapped charges close to the oxide defects can leak out. The good electrical isolation differs a SONOS memory cell from a conventional memory cell having a continuous polysilicon floating gate, which may have all stored charges leak out through a defect in the tunneling oxide layer. Therefore, it is possible to significantly scale down the thickness of the tunneling oxide layer 2 of a SONO memory cell, for example, to between about 2 nm and about 2.5 nm, while the charge retention ability of the SONO memory cell is not noticeably compromised. In addition, with the reduction of the thickness of the tunneling oxide layer, write/erase voltages can be lowered.

Although the SONOS memory devices provide a potential solution for down-scaling the tunneling oxide layer below that of a conventional memory device with a poly floating gate, it is still challenging to scale down the write/erase voltage and maintain the required ten-year data retention. This is caused by the conflicting requirements for write/erase the flash memory cells and retaining data stored in the flash memory cells. For example, to reduce the leakage of the stored charges, blocking oxide layer 6 and tunneling oxide layer 2 preferably have great thicknesses. However, increasing the thicknesses of blocking oxide 6 and tunneling oxide 2 requires the write/erase voltage to be increased. New flash memory cells having good data retaining ability while at the same time with reduced write/erase voltages are thus needed.

SUMMARY OF THE INVENTION

In accordance with one aspect of the present invention, a semiconductor device includes a semiconductor substrate; a tunneling layer over the semiconductor substrate, wherein the tunneling layer has a first conduction band; a storage layer over the tunneling layer, wherein the storage layer has a second conduction band; a blocking layer over the storage layer, wherein the blocking layer has a third conduction band; a gate electrode over the blocking layer; and at least one of a first leakage-inhibition layer and a second leakage-inhibition layer. The first leakage-inhibition layer is between the tunneling layer and the storage layer, and has a fourth conduction band lower than the first conduction band. The second leakage-inhibition layer is between the blocking layer and the gate electrode, and has a fifth conduction band lower than the third conduction band.

In accordance with another aspect of the present invention, a semiconductor device includes a semiconductor substrate; a tunneling layer over the semiconductor substrate, wherein the tunneling layer has a first conduction band; a first leakage-inhibition layer over the tunneling layer, wherein the first leakage-inhibition layer has a second conduction band; and a storage layer over the first leakage-inhibition layer. The storage layer has a third conduction band. The second conduction band is lower than the first conduction band, and higher than the third conduction band. The semiconductor device further includes a blocking layer over the storage layer, wherein the blocking layer has a fourth conduction band; a second leakage-inhibition layer over the blocking layer, wherein the second leakage-inhibition layer has a fifth conduction band; and a gate electrode over the second leakage-inhibition layer. The gate electrode has a sixth conduction band. The fifth conduction band is lower than the fourth conduction band, and higher than the sixth conduction band.

In accordance with yet another aspect of the present invention, a semiconductor device includes a semiconductor substrate; a tunneling layer over the semiconductor substrate, wherein the tunneling layer has a first conduction band; a first leakage-inhibition layer over and contacting the tunneling layer, wherein the first leakage-inhibition layer has a second conduction band; and a storage layer over and contacting the first leakage-inhibition layer. The storage layer has a third conduction band lower than a conduction band of the semiconductor substrate. The second conduction band is lower than the first conduction band, and higher than the third conduction band. The semiconductor device further includes a blocking layer over and contacting the storage layer, wherein the blocking layer has a fourth conduction band; a second leakage-inhibition layer over the blocking layer, wherein the second leakage-inhibition layer has a fifth conduction band; and a gate electrode over and contacting the second leakage-inhibition layer. The gate electrode has a sixth conduction band. The fifth conduction band is lower than the fourth conduction band, and higher than the sixth conduction band.

The advantageous features of the present invention include reduced leakage, prolonged retention time, and reduced write/erase voltages.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A flash memory cell having long data retention time and reduced write/erase voltages is provided. Variations of the preferred embodiments are provided, wherein like reference numbers are used to designate like elements throughout the various views and illustrative embodiments of the present invention. The operation of the preferred embodiments of the present invention is also discussed.

Figure 1:
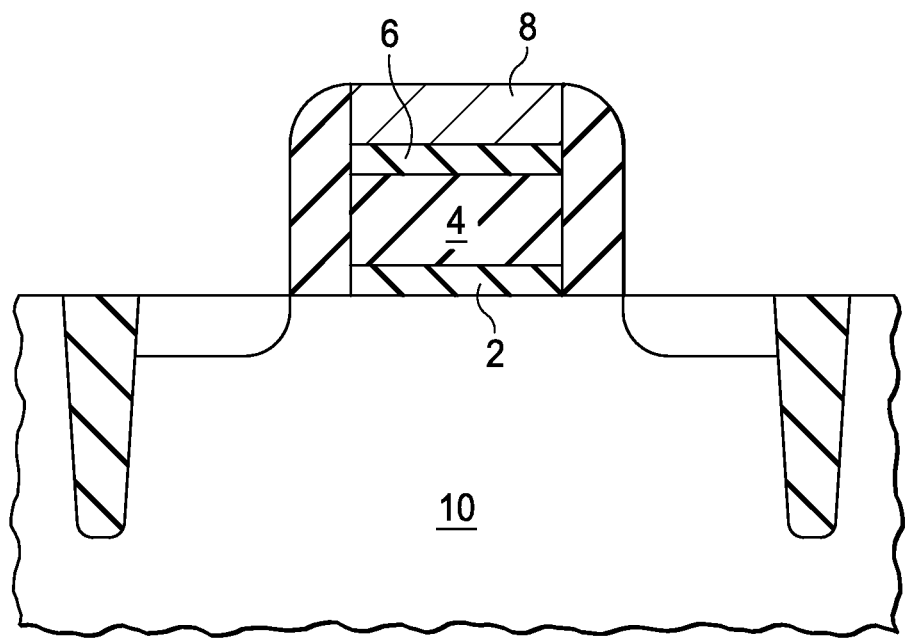
FIG. 1 illustrates a conventional floating-gate flash memory cell.
Figure 2:
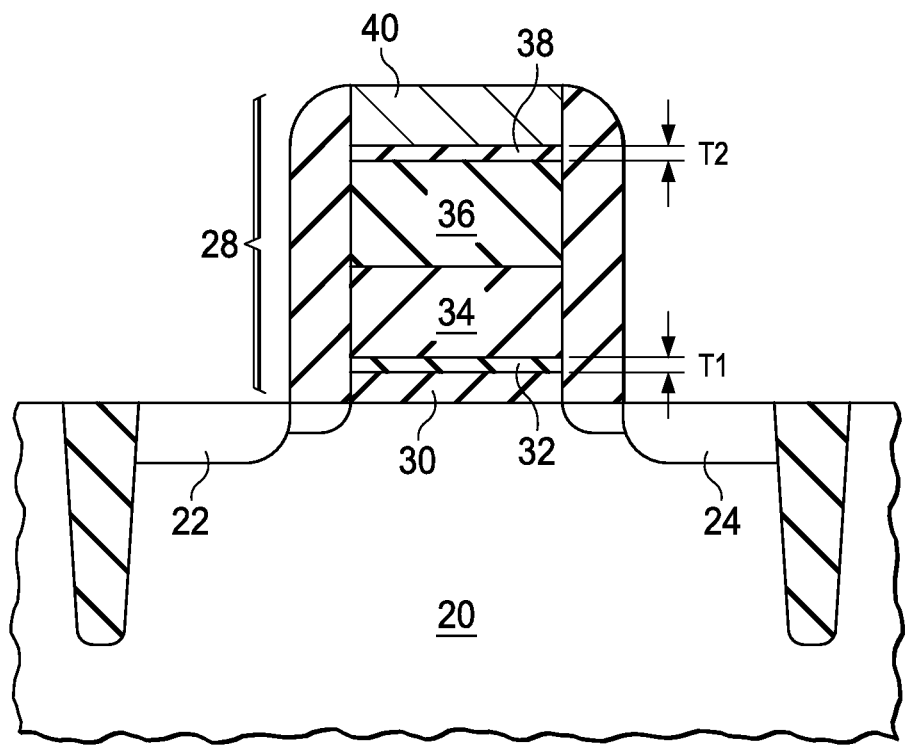
FIG. 2 illustrate a cross-sectional view of an embodiment of the present invention, wherein leakage-inhibition layers are inserted into the gate stack of a flash memory cell.

FIG. 2 illustrates a first embodiment of the present invention, wherein a flash memory cell is formed at a top surface of substrate 20. In an embodiment, substrate 20 is formed of a bulk material such as silicon, silicon germanium, or the like. In alternative embodiments, substrate 20 has a silicon-on-insulator (SOI) structure, with the top layer including silicon, silicon germanium, or the like. Substrate 20 may be lightly doped with a p-type or an n-type impurity. Drain region 22 and a source region 24, which may include either p-type or n-type impurities, are formed in substrate 20.

Gate stack 28, which includes tunneling layer 30, storage layer 34, blocking layer 36, and gate electrode 40, is formed on substrate 20. In the preferred embodiment, gate stack 28 further includes first leakage-inhibition layer 32 and second leakage-inhibition layer 38. In alternative embodiments, either the first leakage-inhibition layer 32 or the second leakage-inhibition layer 38, but not both, is formed.

In an embodiment, tunneling layer 30 comprises an oxide, such as silicon oxide. In other preferred embodiments, tunneling layer 30 comprises a high-k dielectric material, such as HfAlO, $HfO_2$, $Ta_2O_5$, $ZrO_2$, and the like. An advantageous feature for using a high-k dielectric material is that the barrier height between the high-k dielectric material and the underlying silicon substrate 20 is typically low. As is known in the art, there are two typical tunneling mechanisms, Fowler-Nordheim (FN) tunneling and direct tunneling. FN tunneling is typically associated with the barrier height, while direct tunneling is often associated with the thickness of tunneling layer 30. With the low barrier height, the FN tunneling of charges through tunneling layer 30 is relatively easy, and the write/erase voltages can be reduced. Preferably, the barrier height is less than about 3.1 eV. The thickness of tunneling layer 30, however, is preferably increased, so that the direct tunneling, and thus the possible charge-leakage, is reduced. The thickness of tunneling layer 30 may be greater than about 20 Å, and preferably between about 30 Å and about 40 Å.

Figure 3:
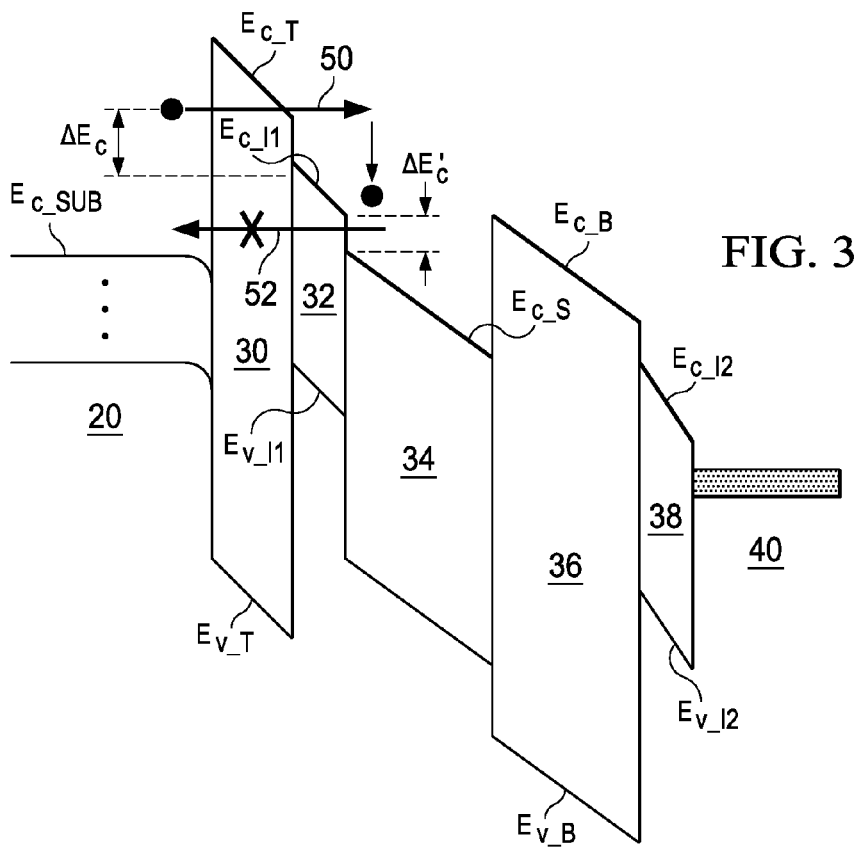
FIG. 3 is an energy band diagram of an embodiment of the present invention during a write operation.
Figure 4:
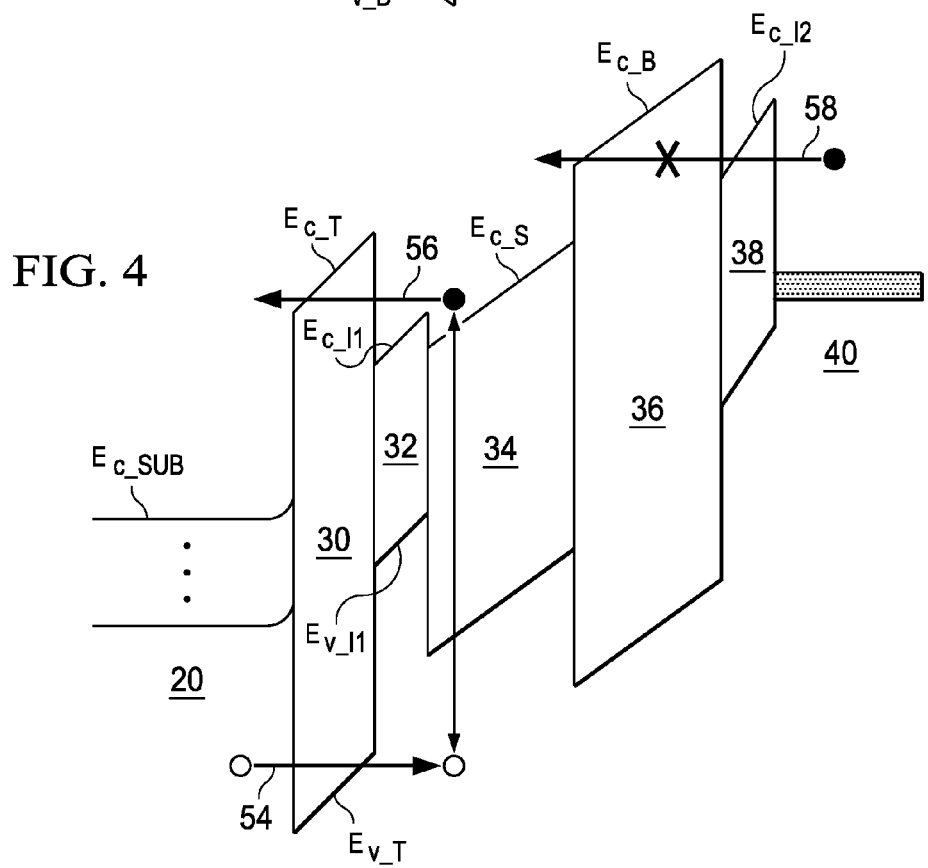
FIG. 4 is an energy band diagram of the embodiment of the present invention during an erase operation.

Preferably, leakage-inhibition layer 32 has a conduction band Ec_I1 lower than the conduction band Ec_T of tunneling layer 30 (refer to FIGS. 3 and 4). The difference ΔEc (referring to FIG. 3) in the conduction bands is preferably greater than about 0.1 eV, and more preferably between about 0.5 eV and about 2.0 eV. Accordingly, leakage-inhibition layer 32 preferably has a smaller band gap (equal to Ec_I1–Ev_I1) than the band gap (equal to Ec_T–Ev_T) of tunneling layer 30. Further, the conduction band Ec_T1 of leakage-inhibition layer 32 is preferably higher than the conduction band Ec_S of storage layer 34. In an exemplary embodiment, tunneling layer 30 is formed of silicon oxide; accordingly, leakage-inhibition layer 32 may be formed of silicon nitride, nitride-rich silicon oxide, silicon oxynitride, or the like. Depending on the material of the tunneling layer 30, leakage-inhibition layer 32 may also be formed of metal nitrides, metal oxynitrides, $TiO_2$, $HfO_2$, $Ta_2O_5$, or the like, or the combinations thereof, providing the energy band gap of leakage-inhibition layer 32 is lower than that of tunneling layer 30. The thickness T1 (refer to FIG. 2) of leakage-inhibition layer 32 is preferably, although not necessarily, less than the thickness of tunneling layer 30, and is also less than the thickness of storage layer 34. In an exemplary embodiment, thickness T1 is less than about 50 Å, and more preferably between about 30 Å and about 10 Å.

Storage layer 34 is formed on leakage-prohibition layer 32. Storage layer 34 is preferably a dielectric layer with a high trap density. In an embodiment, storage layer 34 comprises aluminum nitride (AlN). In other embodiments, storage layer 34 may include other high-k dielectric materials including oxides, nitrides and oxynitrides, such as $Si_3N_4$, $Al_2O_3$, $HfO_2$, HfON, ZrON, and combinations thereof. An advantageous feature of using AlN in storage layer 34 is that AlN has a conduction band lower than the conduction band of conventionally used $Si_3N_4$, thus the band discontinuity between storage layer 34 and the subsequently formed gate electrode 40 is lowered, resulting in a reduced leakage for the charges stored in storage layer 34.

In more preferred embodiments, storage layer 34 further comprises gallium or gallium nitride (GaN) in addition to AlN, forming aluminum gallium nitride (AlGaN). An advantageous feature of GaN is its negative band alignment to silicon, meaning that the conduction band of GaN is not only lower than that of $Si_3N_4$, but also lower than that of silicon substrate 20. Typically, the effective conduction band of AlGaN will be between the conduction bands of AlN and GaN, and the ratio of aluminum and gallium in AlGaN is likely to affect the resulting conduction band. Since GaN has a conduction band lower than the conduction band of silicon, by adjusting the composition of AlGaN, preferably by adding more gallium, the conduction band of AlGaN may be lower than the conduction band of silicon substrate 20 Ec_SUB (refer to FIG. 3), resulting in a negative band alignment.

AlGaN is preferably formed using metal organic chemical vapor deposition (MOCVD). Preferably, the composition of aluminum, gallium and nitride is adjusted to achieve a desirable conduction band and a desirable valence band. In an exemplary embodiment, storage layer 34 comprises between about 30 percent and about 70 percent aluminum, and between about 70 percent and about 30 percent gallium. The preferred thickness of storage layer 34 is greater than about 10 Å, and more preferably between about 80 Å and about 100 Å.

Blocking layer 36 is formed on storage layer 34. Preferably, blocking layer 36 has a low leakage of charges. Accordingly, the blocking layer preferably has a high conduction band Ec_B, so that the barrier height between the conduction band Ec_B of blocking layer 36 and the conduction band of gate electrode 40 is high, preferably greater than about 3.1 eV. Blocking layer 36 is preferably formed of a high-k dielectric material, such as AlLaO$_3$, HfAlO$_3$, HfO$_2$, Ta$_2$O$_5$, Al$_2$O$_3$, ZrO$_2$, TiO$_2$, SrTiO$_3$, and combinations thereof. The k value of the blocking layer 36 is preferably greater than about 3.9, and more preferably greater than about 9. The use of a high-k dielectric material will cause a lower voltage drop in blocking layer 36, and thus the voltage drop in tunneling layer 30 is increased accordingly, making write and erase operations more efficient. As a result, write and erase voltages can be reduced accordingly.

Preferably, leakage-inhibition layer 38 has a conduction band EC_I2 (refer to FIGS. 3 and 4) lower than the conduction band Ec_B of blocking layer 36. Accordingly, leakage-inhibition layer 38 preferably has a smaller band gap (equal to Ec_I2−Ev_I2) than the band gap (equal to Ec_B−Ev_B) of blocking layer 36. In an exemplary embodiment, blocking layer 36 is formed of silicon oxide. Accordingly, leakage-inhibition layer 38 may be formed of silicon nitride, nitride-rich silicon oxide, silicon oxynitride, or the like. Depending on the material of blocking layer 36, leakage-inhibition layer 38 may also be formed of metal nitrides, metal oxynitrides, TiO$_2$, HfO$_2$, Ta$_2$O$_5$, or the like, or the combinations thereof, providing the energy band gap of leakage-inhibition layer 38 is lower than that of blocking layer 36. The thickness T2 of leakage-inhibition layer 38 is preferably less than the thickness of blocking layer 36. More preferably, the thickness T2 is small enough, so that during erase operations, electrons may penetrate leakage-inhibition layer 38 using direct tunneling. In an exemplary embodiment, thickness T2 is less than about 50 Å, and more preferably between about 30 Å and about 10 Å. Further, thickness T1 and thickness T2 are preferably less than the thicknesses of layers 30, 34 and 36.

Gate electrode 40 is preferably a metal-containing layer having a high work function. The high work function helps reduce the undesirable FN tunneling through blocking layer 36, which results in leakage and the replenish of charges into storage layer 34 during the erase operations (also referred to as over-erase). Preferably, the work function of gate electrode 40 is greater than about 4.0 eV, and more preferably greater than about 4.5 eV. In an exemplary embodiment, gate electrode 40 comprises TaN, which has a work function of about 4.7 eV. In other embodiments, gate electrode 40 comprises conductive metal oxides and/or metal oxynitrides. In another exemplary embodiment, gate electrode 40 includes IrO$_2$, which has a work function of about 5.1 eV. In yet other embodiments, gate electrode 40 is a substantially pure-metal gate comprising metals such as iridium, platinum, nickel, palladium, rhodium, and combinations thereof.

The flash memory cell as shown in FIG. 2 may further include lightly doped source/drain (LDD) regions, gate spacers, source/drain silicides (not shown), and the like. The formation processes of these features are well known in the art, and hence are not repeated herein.

The advantageous features of the present invention may be explained using FIGS. 3 and 4. FIG. 3 illustrates an energy band diagram for a write operation. A write operation can be performed by applying a low voltage Vg to gate electrode 40 and a high voltage Vd to drain region 22 (hot electron injection). Alternatively, the write operation is performed by applying a high voltage Vg to gate electrode 40, and thus causing a direct tunneling for thin tunneling layer 30, or an FN tunneling for a thick tunneling layer 30. Preferably, voltage Vg is about 10V to 18V, and more preferably about 13V. The drain and source are preferably grounded.

For the write operation, electrons are programmed through tunneling layer 30 using Folwer-Nordheim (FN) tunneling, wherein the movement of electrons is schematically illustrated by arrow 50. Since leakage-inhibition layer 32 has a conduction band Ec_T1 lower than the conduction band Ec_T of tunneling layer 30, the electrons are injected through leakage-inhibition layer 32 by a ballistic injection. As a result, leakage-inhibition layer 32 has little effect for hampering the write operation, and the addition of leakage-inhibition layer 32 has little effect to the increase in the write voltage.

On the other hand, for the electrons stored in storages layer 34 to leak to substrate 20, direct tunneling is most likely to occur. Since the conduction band Ec_T1 of leakage-inhibition layer 32 is higher than the conduction band Ec_S of storage layer 34, electrons have to tunnel through both leakage-inhibition layer 32 and tunneling layer 30 using direct tunneling. In this case, the insertion of leakage-inhibition layer 32 advantageously reduces the likelihood of the leakage (note the crossed-out arrow 52). The conduction band difference ΔEc′ between conduction bands Ec_I1 and Ec_S is preferably great enough so that leakage-inhibition layer 32 has a noticeable effect of hampering the tunneling of electrons (to prevent leakage), while small enough so that the FN tunneling (for the write operation) is not affected.

Referring to FIG. 4, an erase operation can be performed by applying a low voltage Vg to the gate electrode 40 and a high voltage Vd to drain region 22 (hot hole injection). Alternatively, the erase operation is performed by applying a high voltage Vg (although negative), for example, between about −10V and −18V to gate electrode 40, and thus causing direct tunneling for thin tunneling layer 30, or FN tunneling for thick tunneling layer 30. Drain region 22 and source region 24 are preferably grounded. For the erase operation, holes are programmed through tunneling layer 30 using Folwer-Nordheim (FN) tunneling, wherein the movement of holes is schematically illustrated using arrow 54. Please note the movement of holes is equivalent to erasing of electrons out of storage layer 34 into substrate 20, which is illustrated by arrow 56. Again, leakage-inhibition layer 32 has little effect for hampering the erase operation since the valence band Ev_I1 of leakage-inhibition layer 32 is higher than the valence band Ev_T of tunneling layer 30, and the addition of leakage-inhibition layer 32 has little effect to the increase in the erase voltage.

On the other hand, leakage-inhibition layer 38 has the effect of preventing over-erase, which occurs when electrons are injected into storage layer 34 by tunneling through blocking layer 36 from gate electrode 40, as is shown by the crossed-out arrow 58. It is noted that electrons have to tunnel through both leakage-inhibition layer 38 and blocking layer 36. Particularly, the electrons may need to tunnel through leakage-inhibition layer 38 using direct tunneling, and then tunnel through blocking layer 36 using FN tunneling. The likelihood for electrons penetrate layers 36 and 38 using such a combination of tunneling mechanisms is small. Therefore, the insertion of leakage-inhibition layer 38 advantageously reduces the likelihood of over-erase.

Table 1 illustrates the experimental results of five sample flash memory devices, namely sample 1 through sample 5.

TABLE 1

| | Write/Erase Voltages (Volts) | Initial Threshold Voltage Difference (ΔVth) | Ten-Year decay in Threshold Voltage Difference |
|---|---|---|---|
| Sample 1 (SiO$_2$35 Å/HfON/Al$_2$O$_3$) | 13 | 2.0 | 45% |
| Sample 2 (SiO$_2$45 Å/HfON/Al$_2$O$_3$) | 16 | 2.1 | 29% |
| Sample 3 (SiO$_2$35 Å-SiN18 Å/HfON/Al$_2$O$_3$) | 16 | 2.3 | 17% |
| Sample 4 (SiO$_2$26 Å-SiN18 Å/HfON/Al$_2$O$_3$) | 13 | 2.6 | 27% |
| Sample 5 (SiO$_2$26 Å-SiN18 Å/HfON/Al$_2$O$_3$-SiN18 Å) | 14 | 2.6 | 19% |

Among the five samples, SiO$_2$ is used in tunneling layer 30 (refer to FIG. 2), HfON is used in storage layer 34, and Al$_2$O$_3$ is used in blocking layer 36. In the first column of table 1, the values following SiO$_2$ are the thicknesses of the tunneling layers 30 in the respective samples. The thicknesses of storage layers 34 (HfON) and blocking layers 36 (Al$_2$O$_3$) are the same throughout all five samples. Samples 1 and 2 do not include leakage-inhibition layers 32 and 38. Samples 3 and 4 include leakage-inhibition layer 32 (18 Å of SiN), but do not include leakage-inhibition layer 38. Sample 5 includes both leakage-inhibition layers 32 (18 Å of SiN) and 38 (18 Å of SiN). In all five samples, leakage-inhibition layers 32 and 38 (if exist) are all formed of silicon nitride (SiN), with thicknesses of 18 Å. It is noted that the effective thickness of oxide (EOT) of SiN is roughly a half of that of SiO$_2$. Accordingly, 18 Å of SiN is equivalent to about 9 Å of SiO$_2$ in EOT. The performance of devices may then be compared with reference to the EOT. The "Write/Erase Voltages" column represents the voltage needed for the write/erase operations. The "Initial Threshold Voltage Difference ΔVth" column represents the difference in the initial threshold voltages (between programmed and erased memory cells), which difference is preferably great in order to distinguish stored "0" or "1" easily. The "Ten-Year decay in Threshold Voltage Difference" column (referred to as W/E decay hereinafter) represents, that, after ten years, the reduction percentage of threshold voltage difference between programmed and erased flash memory cells compared to the initial one as shown in the third column of Table 1.

Comparing samples 1 and 2, which are both conventional flash memory samples, it is noted that the increase in the thickness of tunneling layer (35 Å and 45 Å, respectively) results in significant improvement in the W/E decay after ten years (from 45% to 29%), indicating smaller leakages resulted from thicker tunneling layers. However, the increase in the thickness of tunneling layer requires the write/erase voltage to increase from 13 volts to 16 volts. In the subsequent paragraphs, samples 3, 4 and 5 are compared to samples 1 and 2 to show the effect of the embodiments of the present invention.

Regarding sample 3, the total EOT of 35 Å SiO$_2$ tunneling layer 30 and 18 Å of leakage-inhibition layer 32 is similar to that of sample 2. However, the ten-year W/E decay of sample 3 is reduced to 17 percent from the 29 percent of sample 2, indicating the leakage of sample 3 is significantly reduced over sample 2. Similarly, the total EOT of leakage layer 32 and tunneling layer 30 of sample 4 is similar to the EOT of 35 Å SiO$_2$ of sample 1. However, the ten-year W/E decay of sample 4 (27%) is significantly improved over that of sample 1 (45%).

The advantageous feature of the present invention is more clearly revealed by the comparison of samples 2 and 5. The total EOT of leakage-inhibition layers 32 and 38 and tunneling layer 30 of sample 5 is similar to the thickness of the tunneling layer 30 of sample 2 (45 Å). However, it is noted that sample 5 has significantly reduced write/erase voltage, increased difference in initial threshold voltages (between programmed and erased memory cells), and significantly increased W/E decay performance.

The preferred embodiments of the present invention have several advantageous features. The leakages of the flash memory embodiments of the present invention are low, and thus the retention time of the resulting flash memory devices is long. The over-erase is reduced. The write/erase voltages are reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor device comprising:
  a semiconductor substrate;
  a tunneling layer over the semiconductor substrate, wherein the tunneling layer has a first conduction band;
  a first leakage-inhibition layer over the tunneling layer, wherein the first leakage-inhibition layer has a second conduction band;
  a storage layer over the first leakage-inhibition layer, wherein the storage layer has a third conduction band, wherein the second conduction band is lower than the first conduction band, and higher than the third conduc- tion band, and wherein the first leakage-inhibition layer is in contact with the tunneling layer and the storage layer;

a blocking layer over the storage layer, wherein the blocking layer has a fourth conduction band;

a second leakage-inhibition layer over the blocking layer, wherein the second leakage-inhibition layer has a fifth conduction band, and wherein one of the first and the second leakage-inhibition layer comprises a metal nitride or a metal oxynitride; and a gate electrode over the second leakage-inhibition layer, wherein the gate electrode has a sixth conduction band, and wherein the fifth conduction band is lower than the fourth conduction band, and higher than the sixth conduction band, and wherein the second leakage-inhibition layer is in contact with the gate electrode and the blocking layer.

2. The semiconductor device of claim 1, wherein the second conduction band is lower than the first conduction band by greater than about 0.1 eV, and greater than the third conduction band by greater than about 0.1 eV.

3. The semiconductor device of claim 1, wherein the storage layer comprises a high-k dielectric material.

4. The semiconductor device of claim 1, wherein a first energy band gap of the first leakage-inhibition layer is lower than a second energy band gap of the tunneling layer.

5. The semiconductor device of claim 1 further comprising:
a source region having at least a portion in the semiconductor substrate; and
a drain region having at least a portion in the semiconductor substrate, wherein the drain region is on an opposite side of the tunneling layer than the source region.

6. The semiconductor device of claim 1, wherein the one of the first and the second leakage-inhibition layer comprises the metal nitride.

7. The semiconductor device of claim 6, wherein the metal nitride is selected from the group consisting essentially of $TiO_2$, $HfO_2$, $Ta_2O_5$, and combinations thereof.

8. The semiconductor device of claim 1, wherein the one of the first and the second leakage-inhibition layer comprises the metal oxynitride.

9. A semiconductor device comprising:
a semiconductor substrate;
a tunneling layer over the semiconductor substrate, wherein the tunneling layer has a first conduction band;
a first leakage-inhibition layer over and contacting the tunneling layer, wherein the first leakage-inhibition layer has a second conduction band;
a storage layer over and contacting the first leakage-inhibition layer, wherein the storage layer has a third conduction band lower than a conduction band of the semiconductor substrate, and wherein the second conduction band is lower than the first conduction band, and higher than the third conduction band;
a blocking layer over and contacting the storage layer, wherein the blocking layer has a fourth conduction band;
a second leakage-inhibition layer over the blocking layer, wherein the second leakage-inhibition layer has a fifth conduction band, and wherein one of the first and the second leakage-inhibition layers comprise a material selected from the group consisting essentially of $TiO_2$, $HfO_2$, $Ta_2O_5$, and combinations thereof; and
a gate electrode over and contacting the second leakage-inhibition layer, wherein the gate electrode has a sixth conduction band, and wherein the fifth conduction band is lower than the fourth conduction band, and higher than the sixth conduction band.

10. The semiconductor device of claim 9, wherein the first and the second leakage-inhibition layers are thinner than the tunneling layer, the storage layer, and the blocking layer.

11. The semiconductor device of claim 9, wherein the first leakage-inhibition layer has an energy band gap lower than an energy band gap of the tunneling layer, and wherein the second leakage-inhibition layer has an energy band gap lower than an energy band gap of the blocking layer.

* * * * *